United States Patent
Xie et al.

(10) Patent No.: US 12,463,128 B2
(45) Date of Patent: Nov. 4, 2025

(54) INTERCONNECT STRUCTURES WITH VIAS HAVING VERTICAL AND HORIZONTAL SECTIONS

(71) Applicant: International Business Machines Corporation, Armonk, NY (US)

(72) Inventors: Ruilong Xie, Niskayuna, NY (US); Lawrence A. Clevenger, Saratoga Springs, NY (US); Albert M. Chu, Nashua, NH (US); Brent A. Anderson, Jericho, VT (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 17/878,270

(22) Filed: Aug. 1, 2022

(65) Prior Publication Data
US 2024/0038656 A1    Feb. 1, 2024

(51) Int. Cl.
*H01L 23/522* (2006.01)
*H01L 21/768* (2006.01)

(52) U.S. Cl.
CPC .... *H01L 23/5226* (2013.01); *H01L 21/76816* (2013.01); *H01L 21/76834* (2013.01)

(58) Field of Classification Search
CPC ........... H01L 23/5226; H01L 21/76816; H01L 21/76834
USPC ...................................................... 257/774
See application file for complete search history.

(56) References Cited

U.S. PATENT DOCUMENTS

| | | | |
|---|---|---|---|
| 7,659,160 B2 | 2/2010 | Belyansky et al. | |
| 9,324,650 B2 | 4/2016 | Edelstein et al. | |
| 9,735,029 B1 | 8/2017 | Chu et al. | |
| 9,905,509 B2 | 2/2018 | Chen et al. | |
| 9,953,915 B2 | 4/2018 | Chen et al. | |
| 9,966,337 B1 | 5/2018 | Briggs et al. | |
| 10,177,028 B1 | 1/2019 | LiCausi et al. | |
| 10,729,012 B2 | 7/2020 | Castro et al. | |
| 10,854,542 B2 | 12/2020 | Chang et al. | |
| 12,284,924 B2 * | 4/2025 | Leong | H10N 70/021 |
| 2009/0286396 A1 | 11/2009 | Yamazaki | |
| 2016/0056104 A1 | 2/2016 | Bouche et al. | |
| 2017/0140986 A1 | 5/2017 | Machkaoutsan et al. | |
| 2018/0096932 A1 | 4/2018 | Xie et al. | |
| 2018/0315654 A1 | 11/2018 | Briggs et al. | |

FOREIGN PATENT DOCUMENTS

KR    20110002242 A    1/2011

* cited by examiner

*Primary Examiner* — Tu-Tu V Ho
(74) *Attorney, Agent, or Firm* — Samuel Waldbaum; Ryan, Mason & Lewis, LLP (57) ABSTRACT

A microelectronic structure comprises a first interconnect line at a first interconnect level, a second interconnect line at a second interconnect level, and at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

20 Claims, 10 Drawing Sheets

FIG. 10

INTERCONNECT STRUCTURES WITH VIAS HAVING VERTICAL AND HORIZONTAL SECTIONS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming interconnect structures including vias having vertical and horizontal sections, the vias connecting interconnect lines in different levels of the interconnect structures.

In one embodiment, a microelectronic structure comprises a first interconnect line at a first interconnect level, a second interconnect line at a second interconnect level, and at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

In another embodiment, an integrated circuit comprises an interconnect structure comprising a first interconnect line at a first interconnect level, a second interconnect line at a second interconnect level, and at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

In another embodiment, a method of forming a microelectronic structure comprises forming a first interconnect line at a first interconnect level, forming a second interconnect line at a second interconnect level, and forming at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

DETAILED DESCRIPTION

Illustrative embodiments of the invention may be described herein in the context of illustrative methods for forming interconnect structures including vias having vertical and horizontal sections, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

With continuous scaling, more and more devices (e.g., transistors) are packed into integrated circuit chips (e.g., into one or more 100 millimeter (mm)$^2$ chips). To provide desired functionality, the devices must be interconnected through wiring and routing. With an increased number of devices in an integrated circuit, more and more wiring and routing resources are required to precisely connect the integrated circuit as desired for a particular use case. Thus, for example, more and more metal layers may be needed to connect all of the devices in an integrated circuit.

In a conventional approach an integrated circuit may include front-end-of-line (FEOL) processing for fabricating devices (e.g., transistors, capacitors, resistors, etc.) on a wafer and BEOL processing for interconnecting such devices on the wafer. More particularly, BEOL processes are typically focused on forming metal interconnects between the different devices of an integrated circuit, whereas the fabrication of the different devices that make up the integrated circuit is typically done during FEOL processing.

In FEOL processing, devices such as complementary metal-oxide-semiconductor (CMOS) field-effect transistors (FETs) are formed by a series of steps. For example, masking layers (e.g., photolithographic masks) may be used to form patterns on a semiconductor substrate or wafer. Such masking layers may be used to control or define specific regions where material is to be etched or removed, as well as to control or define specific regions where material is to be formed (e.g., through deposition, growth, etc.). In some cases, materials may be blanket deposited, followed by patterning of one or more masking layers to remove previously deposited materials in some areas while leaving the previously deposited material in other areas.

In BEOL processing, fabrication of an integrated circuit continues by forming interconnects through one or more layers of wiring and dielectric passivation layers over active devices in a FEOL region formed during the FEOL processing. Interconnections or interconnects may include metallic structures that are formed in multiple levels of interlayer dielectric (ILD) layers for electrically connecting the various devices in the FEOL region. Following FEOL and BEOL processing, a wafer may be separated or divided into multiple integrated circuit chips by dicing or other suitable techniques.

To improve scaling, "zero" via enclosures may be utilized where there is tip to tip connection of interconnect lines with zero track skipping. The zero track skipping at the metal layer above pins or vias enables block area scaling from an improved number of pin or via hit points. For via level "V0" and metal interconnect level "M1", for example, zero via enclosures may provide 10% or greater block area reduction. The value of zero via enclosures may diminish for higher metal interconnect levels since routing may do an adequate job in avoiding tight track-to-track connections. Zero via enclosures provide increased benefits for shorter cell height with limited pin or via access. Zero via enclosures can also provide benefits for certain circuit layouts. For example, the use of zero track skipping at connections to gates enables efficient cross-coupling using four tracks rather than five tracks.

Figure 1A:
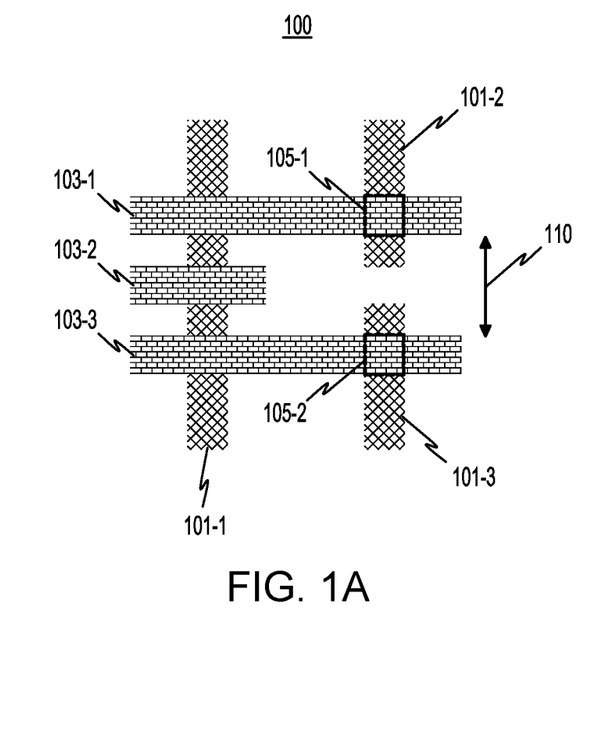
FIG. 1A depicts a top-down view of a structure implementing one track skipping for interconnect lines, according to an embodiment of the invention.

FIG. 1A shows a top-down view 100 of a structure that implements one track skipping for interconnect lines. Here, the structure includes a first level (e.g., Mx-1) of metal interconnect lines including metal interconnect lines 101-1, 101-2 and 101-3, and a second level (e.g. Mx) of metal interconnect lines including metal interconnect lines 103-1, 103-2 and 103-3. Here, there are vias 105-1 and 105-2 that connect the metal interconnect lines in the Mx-1 and Mx levels. The via 105-1 interconnects metal interconnect line 101-2 and metal interconnect line 103-1, and the via 105-2 interconnects metal interconnect line 101-3 and metal interconnect line 103-3. As illustrated, there is a distance 110 between the vias 105-1 and 105-2, where the distance 110 represents one track skipping.

Figure 1B:
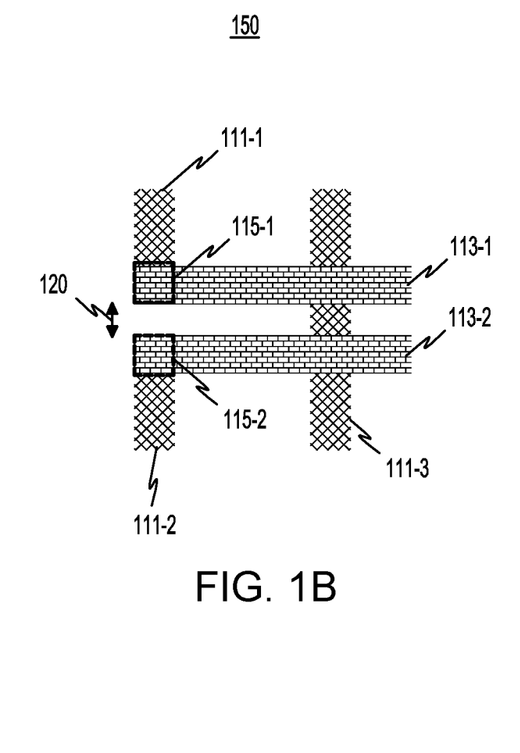
FIG. 1B depicts a top-down view of a structure implementing zero track skipping for interconnect lines, according to an embodiment of the invention.

FIG. 1B shows a top-down view 150 of a structure that implements zero track skipping for interconnect lines. Here, the structure includes a first level (e.g., Mx-1) of metal interconnect lines including metal interconnect lines 111-1, 111-2 and 111-3, and a second level (e.g. Mx) of metal interconnect lines including metal interconnect lines 113-1 and 113-2. Here, there are vias 115-1 and 115-2 that connect the metal interconnect lines in the Mx-1 and Mx levels. The via 115-1 interconnects metal interconnect line 111-1 and metal interconnect line 113-1, and the via 115-2 interconnects metal interconnect line 111-2 and metal interconnect line 113-2. As illustrated, there is a distance 120 between the vias 115-1 and 115-2, where the distance 120 represents zero track skipping. Advantageously, the distance 120 is smaller than the distance 110.

While zero track skipping provides area benefits, there is limited room for metal interconnect line "extensions" (e.g., where the metal interconnect lines extend past where the vias will be formed, allowing some tolerance for via misalignment). Illustrative embodiments provide techniques which enable zero track skipping with zero, and potentially even negative, interconnect line extensions to the vias connecting metal interconnect lines in different interconnect levels. By way of example, Mx→Vx→Mx-1 connections are enabled with zero or negative line extension in the Mx and Mx-1 levels to the Vx vias. More generally, at least one microelectronic structure is provided comprising at least one bottom (e.g., Mx-1) metal line, at least one top (e.g., Mx) metal line, and an interconnect (e.g., a via in via level Vx) connecting the at least one bottom metal line and the at least one top metal line. The interconnect includes a vertical section and at least one horizontal section, where the horizontal section is in contact with the at least one bottom metal line.

In some embodiments, an interconnect structure is provided with at least one bottom (e.g., Mx-1) metal line, at least one via (e.g., Vx) and at least one top (e.g., Mx) metal line which are connected together with an "L" shaped layout, where the bottom metal line has at least one end with a zero or negative line extension to the at least one via, and the top metal line has at least one end with a zero or negative line extension to the at least one via. The bottom metal line may have a top dielectric capping layer, and the top metal line may have a bottom dielectric capping layer. The at least one via at an L-shape corner may have at least one of a via extension into the top dielectric capping layer of the bottom metal line and a via extension into the bottom dielectric capping layer of the top metal line.

A detailed process flow for forming interconnect structures including vias having vertical and horizontal sections will now be described with respect to FIGS. 2A-8C.

Figure 2A:
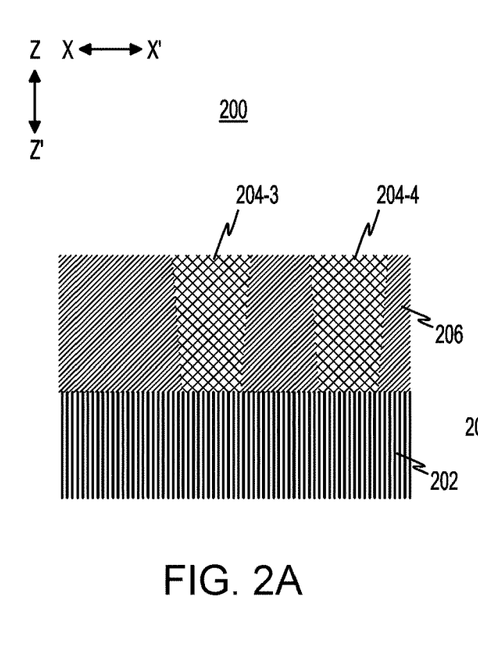
FIG. 2A depicts a first side cross-sectional view of a structure following formation of a first level of interconnect lines, according to an embodiment of the invention.
Figure 2B:
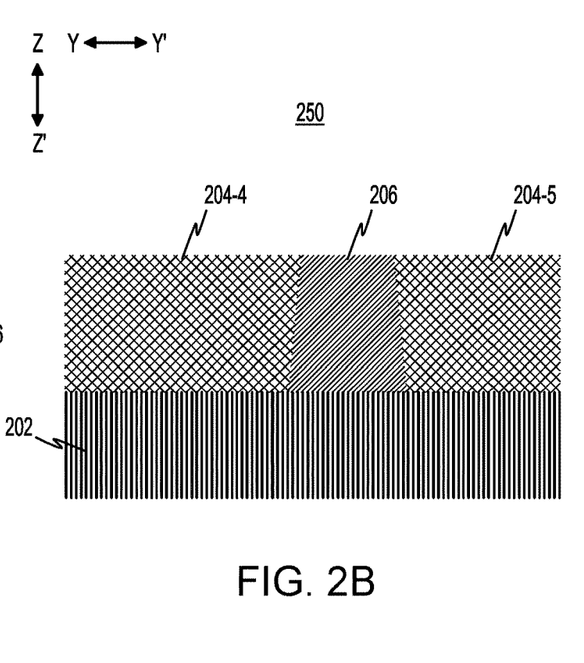
FIG. 2B depicts a second side cross-sectional view of a structure following formation of a first level of interconnect lines, according to an embodiment of the invention.
Figure 2C:
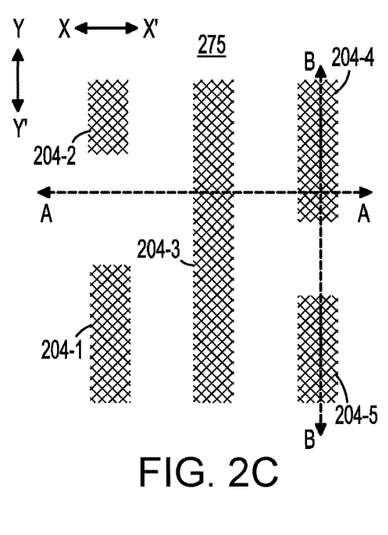
FIG. 2C depicts a top-down view of a structure following formation of a first level of interconnect lines, according to an embodiment of the invention.

FIG. 2A shows a first side cross-sectional view 200 of a structure, following formation of a first level (e.g., Mx-1) of interconnect lines. FIG. 2B shows a second side cross-sectional view 250 of the structure, and FIG. 2C shows a top-down view 275 of the structure. The first side cross-sectional view 200 of FIG. 2A is taken along the line A-A in the top-down view 275, and the second side cross-sectional view 250 of FIG. 2B is taken along the line B-B in the top-down view 275.

The structure of FIGS. 2A-2C includes underlying layers 202, which may include one or more devices (e.g., FEOL devices), one or more other levels of interconnect lines (e.g., Mx-2, Mx-3, etc.), one or more via levels (e.g., Vx-1, Vx-2, etc.). The first level (e.g., Mx-1) of interconnect lines 204-1, 204-2, 204-3, 204-4 and 204-5 (collectively, interconnect lines 204) are formed over the underlying layers 202. The interconnect lines 204 are surrounded by an ILD layer 206.

The ILD layer 206 may be formed by depositing an ILD material such as $SiO_2$, high temperature oxide, low temperature oxide, flowable oxide, a low-k dielectric material, or another suitable isolation material. A low-k dielectric material can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ), methylsilsesquioxane (MSQ), SiON, SiCN, BN, SiBN, SiBCN, silicon SiOCN, and combinations thereof.

The ILD material may then be patterned to form trenches. The trenches and overall structure is then filled with the material of the interconnect lines 204. Chemical mechanical planarization (CMP) is then performed, stopping on the top surface of the ILD layer 206 to result in the interconnect lines 204 shown in FIGS. 2A-2C. The interconnect lines 204 may be formed of a metal material such as cobalt (Co), tungsten (W), copper (Cu) or another suitable materials such as molybdenum (Mo), ruthenium (Ru) with a thin adhesion liner such as titanium nitride (TiN), tantalum nitride (TaN), etc. Each of the interconnect lines 204 may have a width (in direction X-X') in the range of 7 to 100 nanometers (nm) and a height (in direction Z-Z') in the range of 20 to 200 nm.

Figure 3A:
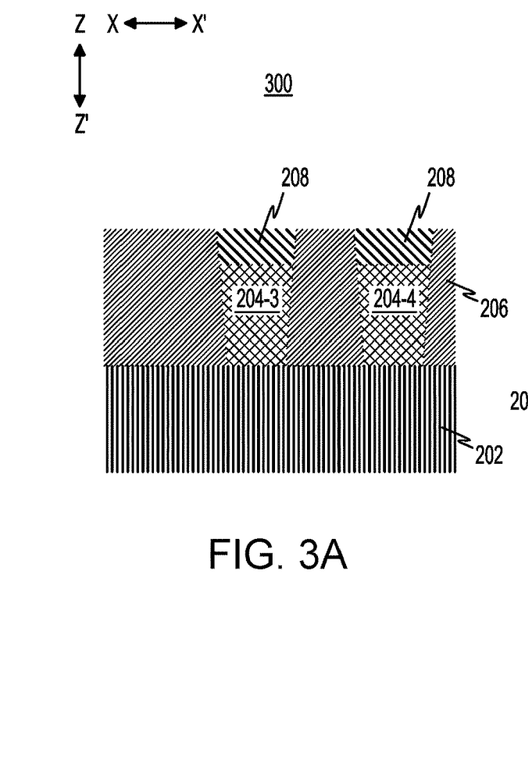
FIG. 3A depicts a first side cross-sectional view of the structure shown in FIGS. 2A-2C following recess of the first level of interconnect lines and formation of a dielectric capping layer, according to an embodiment of the invention.
Figure 3B:
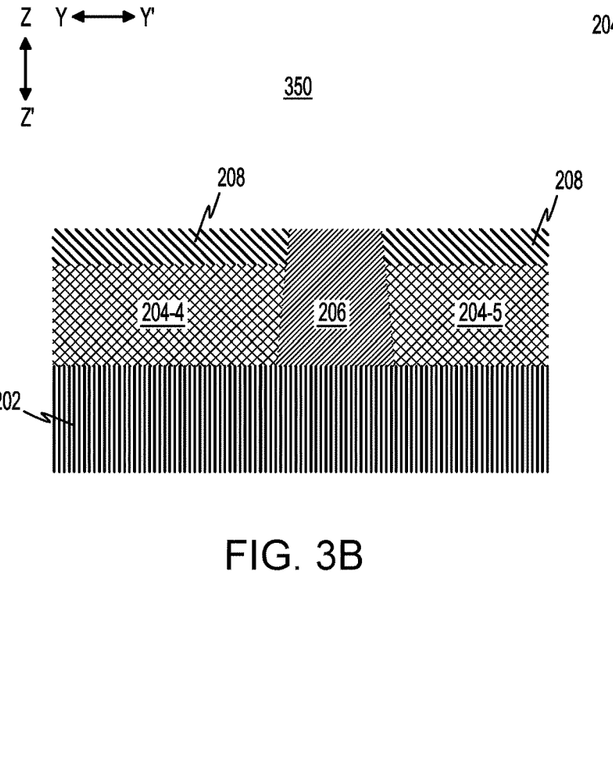
FIG. 3B depicts a second side cross-sectional view of the structure shown in FIGS. 2A-2C following the recess of the first level of interconnect lines and the formation of the dielectric capping layer, according to an embodiment of the invention.
Figure 3C:
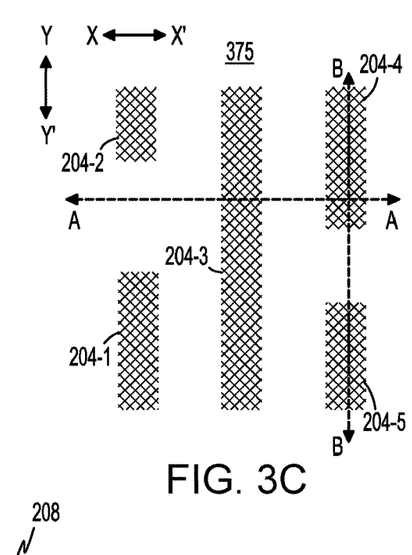
FIG. 3C depicts a top-down view of the structure shown in FIGS. 2A-2C following the recess of the first level of interconnect lines and the formation of the dielectric capping layer, according to an embodiment of the invention.

FIGS. 3A-3C show a first side cross-sectional view 300, a second side cross-sectional view 350 and a top-down view 375 of the structure shown in FIGS. 2A-2C, following recess of the interconnect lines 204 and formation of a dielectric capping layer 208. The first side cross-sectional view 300 of FIG. 3A is taken along the line A-A in the top-down view 375, and the second side cross-sectional view 350 of FIG. 3B is taken along the line B-B in the top-down view 375.

The interconnect lines 204 may be recessed using reactive-ion etching (RIE) or other suitable etch processing which removes the material of the interconnect lines 204 selective to the ILD material of the ILD layer 206. The dielectric capping layer 208 may then be deposited to overfill the structure, followed by CMP or other suitable processing to result in the structure shown in FIGS. 3A-3C. The dielectric capping layer 208 may be formed of a suitable dielectric material that may be etched selective to the ILD material of the ILD layer 206. For example, the dielectric capping layer 208 may be formed of silicon nitride (SiN) or another suitable material such as silicon carbon oxide (SiCO), aluminum oxide ($AlO_x$), aluminum nitride ($AlN_x$), etc. The dielectric capping layer 208 may have a height (in direction Z-Z') in the range of 5 to 30 nm.

Figure 4A:
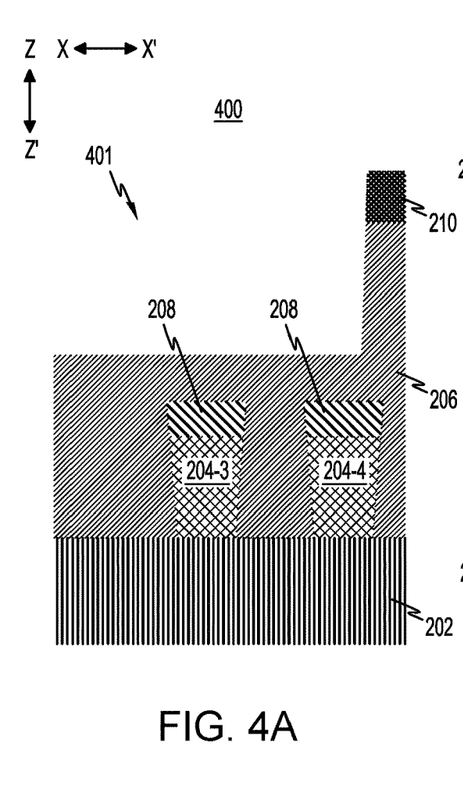
FIG. 4A depicts a first side cross-sectional view of the structure shown in FIGS. 3A-3C following deposition and patterning of an interlayer dielectric layer for a second level of interconnect lines, according to an embodiment of the invention.
Figures 4B, 4C:
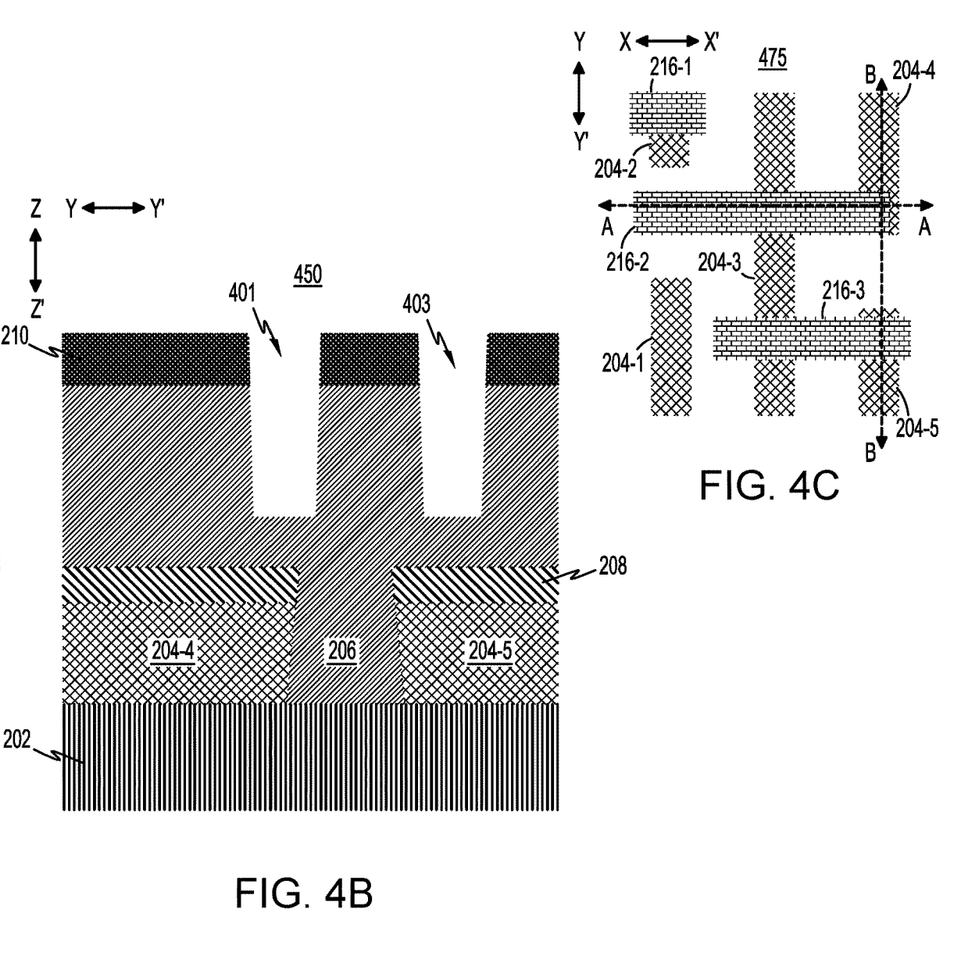
FIG. 4B depicts a second side cross-sectional view of the structure shown in FIGS. 3A-3C following the deposition and patterning of the interlayer dielectric layer for the second level of interconnect lines, according to an embodiment of the invention.
FIG. 4C depicts a top-down view of the structure shown in FIGS. 3A-3C following the deposition and patterning of the interlayer dielectric layer for the second level of interconnect lines, according to an embodiment of the invention.

FIGS. 4A-4C show a first side cross-sectional view 400, a second side cross-sectional view 450 and a top-down view 475 of the structure shown in FIGS. 3A-3C, following deposition and patterning of additional ILD material of the ILD layer 206 for a second level (e.g., Mx) of interconnect lines. The first side cross-sectional view 400 of FIG. 4A is taken along the line A-A in the top-down view 475, and the second side cross-sectional view 450 of FIG. 4B is taken along the line B-B in the top-down view 475.

The additional ILD material of the ILD layer 206 may be deposited to overfill the structure shown in FIGS. 3A-3C, followed by formation and patterning of a hard mask (HM) layer 210. The HM layer 210 is patterned in regions 401 and 403 where the second level of interconnect lines 216-1, 216-2 and 216-3 (collectively, interconnect lines 216) shown in the top-down view 475 of FIG. 4C will be later formed as described below. The HM layer 210 may be formed of SiN, a multi-layer of SiN and $SiO_2$ or another suitable material such as TiN, titanium oxide ($TiO_x$), silicon oxynitride (SiON), etc. The HM layer 210 may have a height (in direction Z-Z') in the range of 20 to 100 nm.

Figure 5A:
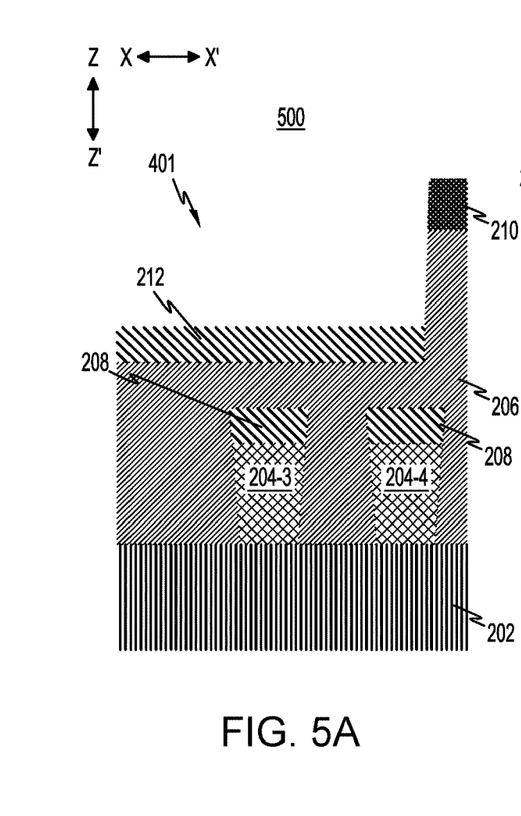
FIG. 5A depicts a first side cross-sectional view of the structure shown in FIGS. 4A-4C following formation of an additional dielectric capping layer, according to an embodiment of the invention.
Figures 5B, 5C:
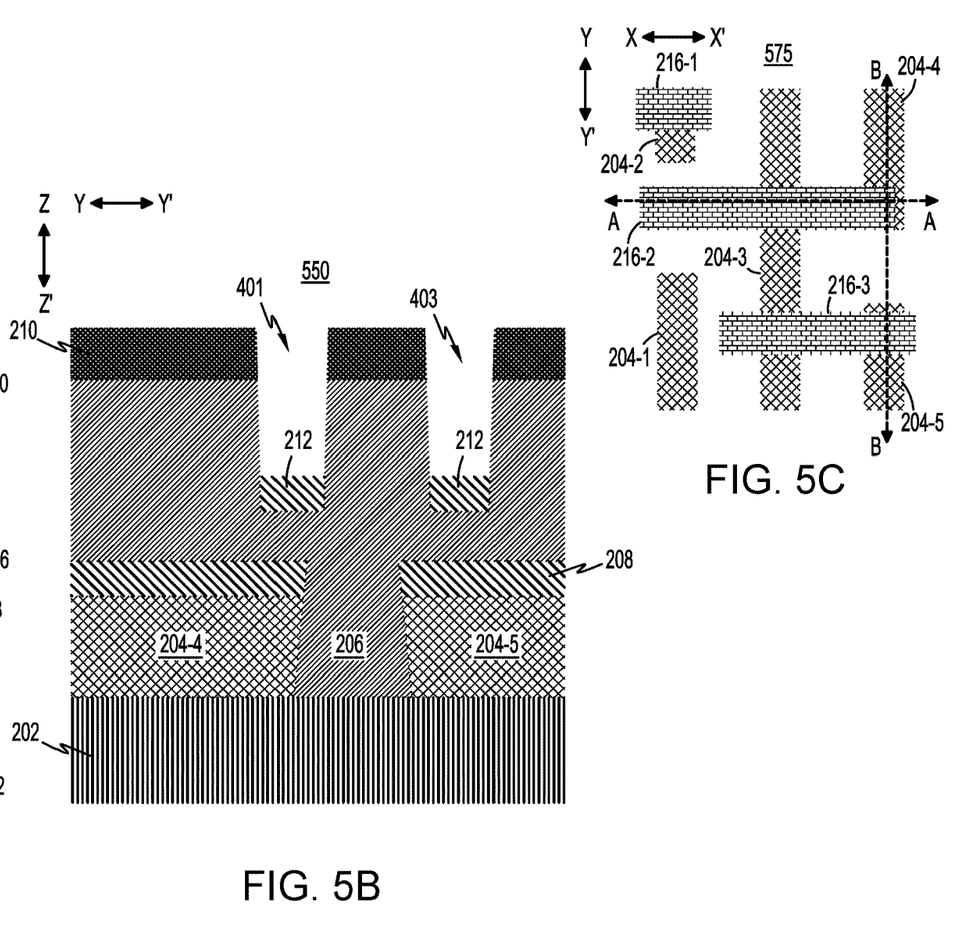
FIG. 5B depicts a second side cross-sectional view of the structure shown in FIGS. 4A-4C following the formation of the additional dielectric capping layer, according to an embodiment of the invention.
FIG. 5C depicts a top-down view of the structure shown in FIGS. 4A-4C following the formation of the additional dielectric capping layer, according to an embodiment of the invention.

FIGS. 5A-5C show a first side cross-sectional view 500, a second side cross-sectional view 550 and a top-down view 575 of the structure shown in FIGS. 4A-4C, following formation of an additional dielectric capping layer 212 (e.g., in the bottoms of regions 401 and 403 where the second level of interconnect lines 216 will later be formed). The first side cross-sectional view 500 of FIG. 5A is taken along the line A-A in the top-down view 575, and the second side cross-sectional view 550 of FIG. 5B is taken along the line B-B in the top-down view 575. The additional dielectric capping layer 212 may be formed using similar materials, and with similar processing and size as that described above with respect to the dielectric capping layer 208. In some embodiments, the dielectric capping layer 212 may be formed by a directional deposition process such as gas cluster ion beam (GCM) or high density plasma (HDP) deposition. Trenches for the Mx level of interconnects can be overfilled by the material of the dielectric capping layer 212, followed by planarization and recess to result in the dielectric capping layer 212 at the bottom of the Mx trenches as shown in FIGS. 5A and 5B.

Figure 6A:
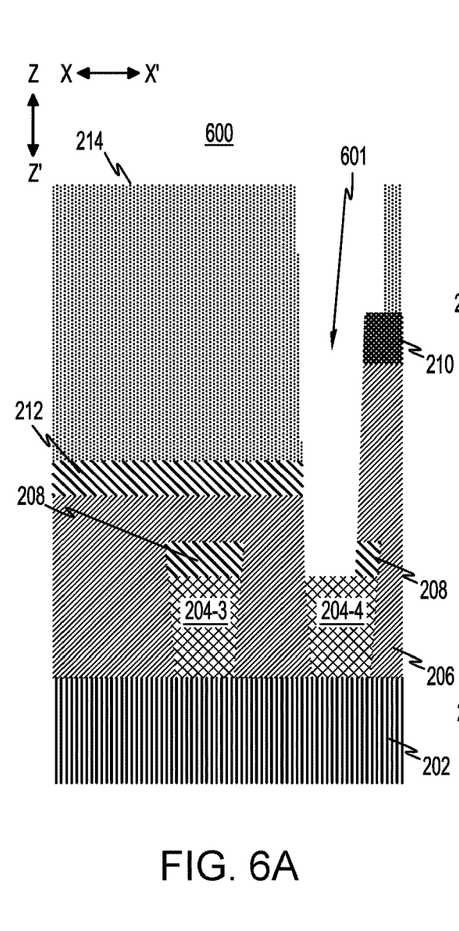
FIG. 6A depicts a first side cross-sectional view of the structure shown in FIGS. 5A-5C following self-aligned patterning of vias for connecting the first and second levels of interconnect lines, according to an embodiment of the invention.
Figures 6B, 6C:
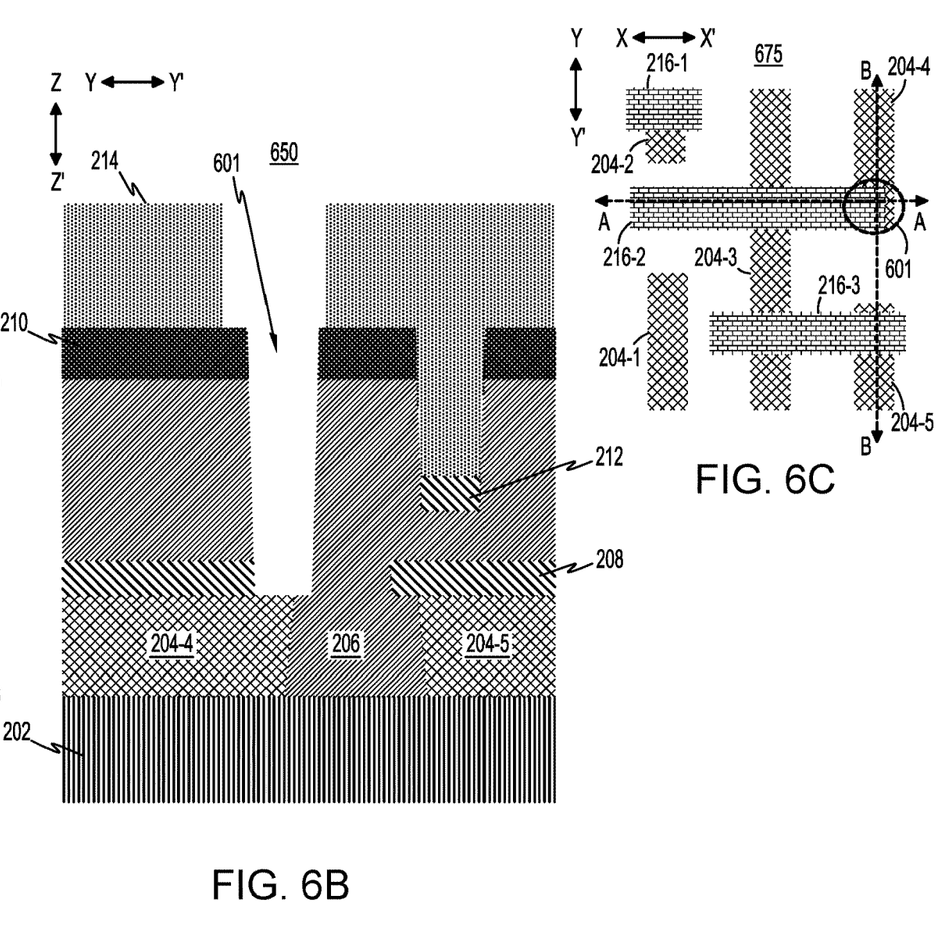
FIG. 6B depicts a second side cross-sectional view of the structure shown in FIGS. 5A-5C following the self-aligned patterning of the vias for connecting the first and second levels of interconnect lines, according to an embodiment of the invention.
FIG. 6C depicts a top-down view of the structure shown in FIGS. 5A-5C following the self-aligned patterning of the vias for connecting the first and second levels of interconnect lines, according to an embodiment of the invention.

FIGS. 6A-6C show a first side cross-sectional view 600, a second side cross-sectional view 650 and a top-down view 675 of the structure shown in FIGS. 5A-5C, following self-aligned patterning of openings 601 for vias (e.g., of a "Vx" via level) interconnecting the first (e.g., Mx-1) and second (e.g., Mx) interconnect levels. The first side cross-sectional view 600 of FIG. 6A is taken along the line A-A in the top-down view 675, and the second side cross-sectional view 650 of FIG. 6B is taken along the line B-B in the top-down view 675.

To form the openings 601, a patterning layer 214 is deposited. A mask layer (not shown) may be patterned over the patterning layer 214 to expose the region where the opening 601 is shown in FIGS. 6A-6C. The patterning layer 214 overfills the structure (e.g., above the HM layer 210), and may be formed of an OPL material. The opening 601, as illustrated, etches through the exposed portions of the dielectric capping layers 208 and 212, as well exposed portions of the ILD material of the ILD layer 206.

Figure 7A:
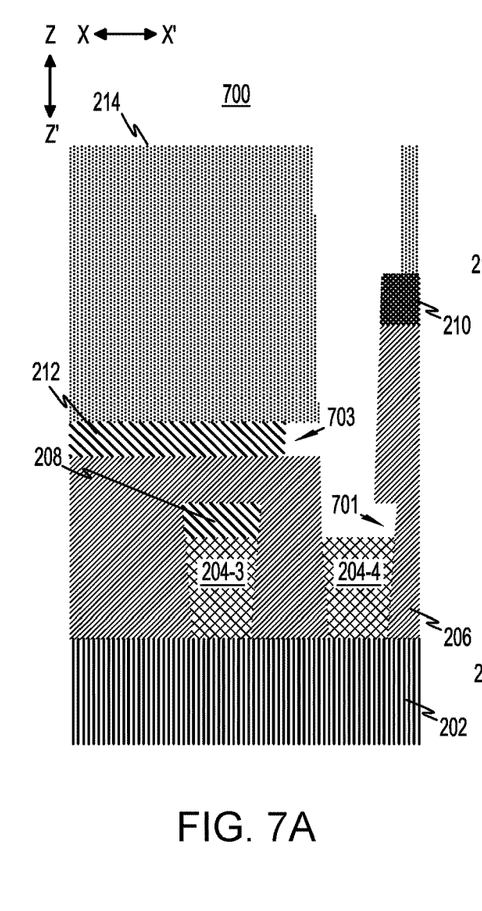
FIG. 7A depicts a first side cross-sectional view of the structure shown in FIGS. 6A-6C following isotropic etching of exposed portions of the dielectric capping layers, according to an embodiment of the invention.
Figures 7B, 7C:
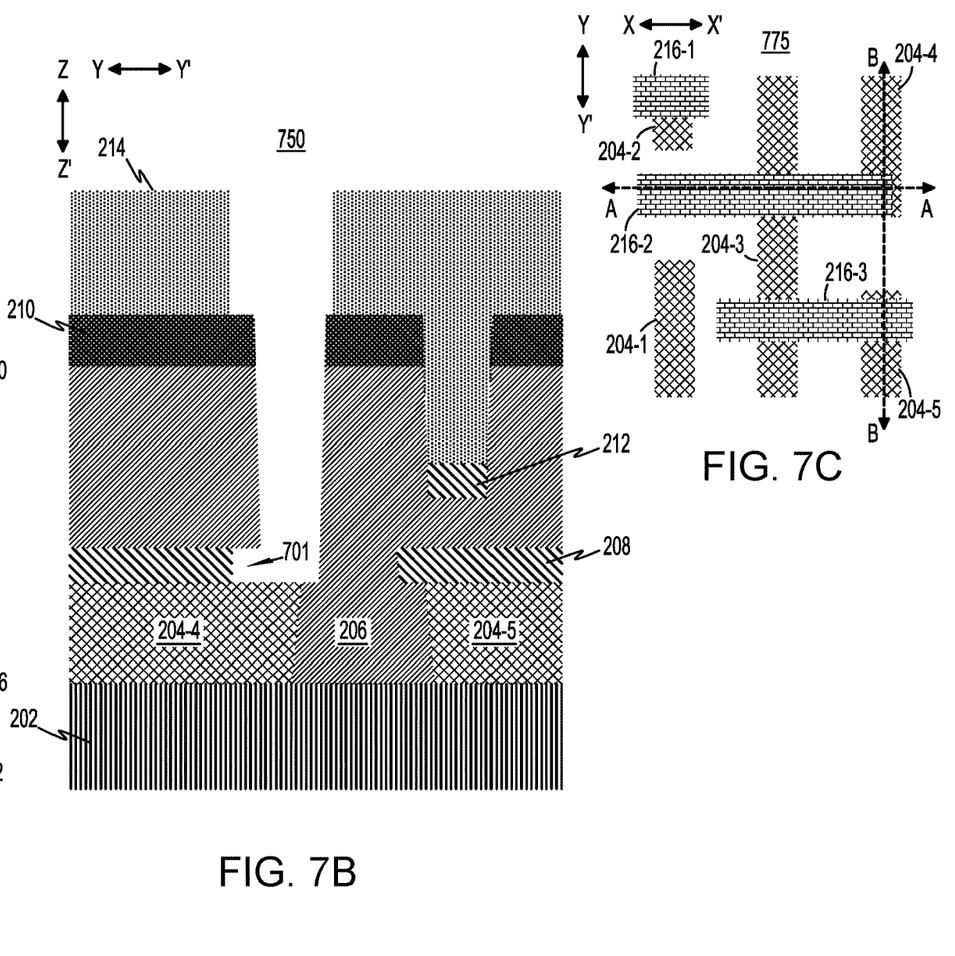
FIG. 7B depicts a second side cross-sectional view of the structure shown in FIGS. 6A-6C following the isotropic etching of the exposed portions of the dielectric capping layers, according to an embodiment of the invention.
FIG. 7C depicts a top-down view of the structure shown in FIGS. 6A-6C following the isotropic etching of the exposed portions of the dielectric capping layers, according to an embodiment of the invention.

FIGS. 7A-7C show a first side cross-sectional view 700, a second side cross-sectional view 750 and a top-down view 775 of the structure shown in FIGS. 6A-6C, following isotropic etching of exposed portions of the dielectric capping layers 208 and 212. The first side cross-sectional view 700 of FIG. 7A is taken along the line A-A in the top-down view 775, and the second side cross-sectional view 750 of FIG. 7B is taken along the line B-B in the top-down view 775.

As shown in FIGS. 7A-7C, the isotropic etching extends into regions 701 and 703 of the dielectric capping layers 208 and 212. The region 701 shows where a portion of the dielectric capping layer 208 formed over the interconnect line 204-4 is removed, while the region 703 shows where a portion of the dielectric capping layer 212 (e.g., formed for interconnect line 216-2 as described below) is removed. The isotropic etching may continue until desired amounts of the dielectric capping layers 208 and 212 are removed (e.g., to ensure there is a strong landing of later-formed vias in the Vx level which interconnect lines in the Mx and Mx-1 interconnect levels). In the example of FIGS. 7A-7C, the remaining portion of the dielectric capping layer 208 over the interconnect line 204-4 in the direction X-X' is removed as shown in region 701. The dielectric capping layer 212 is recessed in direction X-X' as shown in region 703 (e.g., to a distance in the range of 3 to 15 nm).

Figures 8A, 8B, 8C:
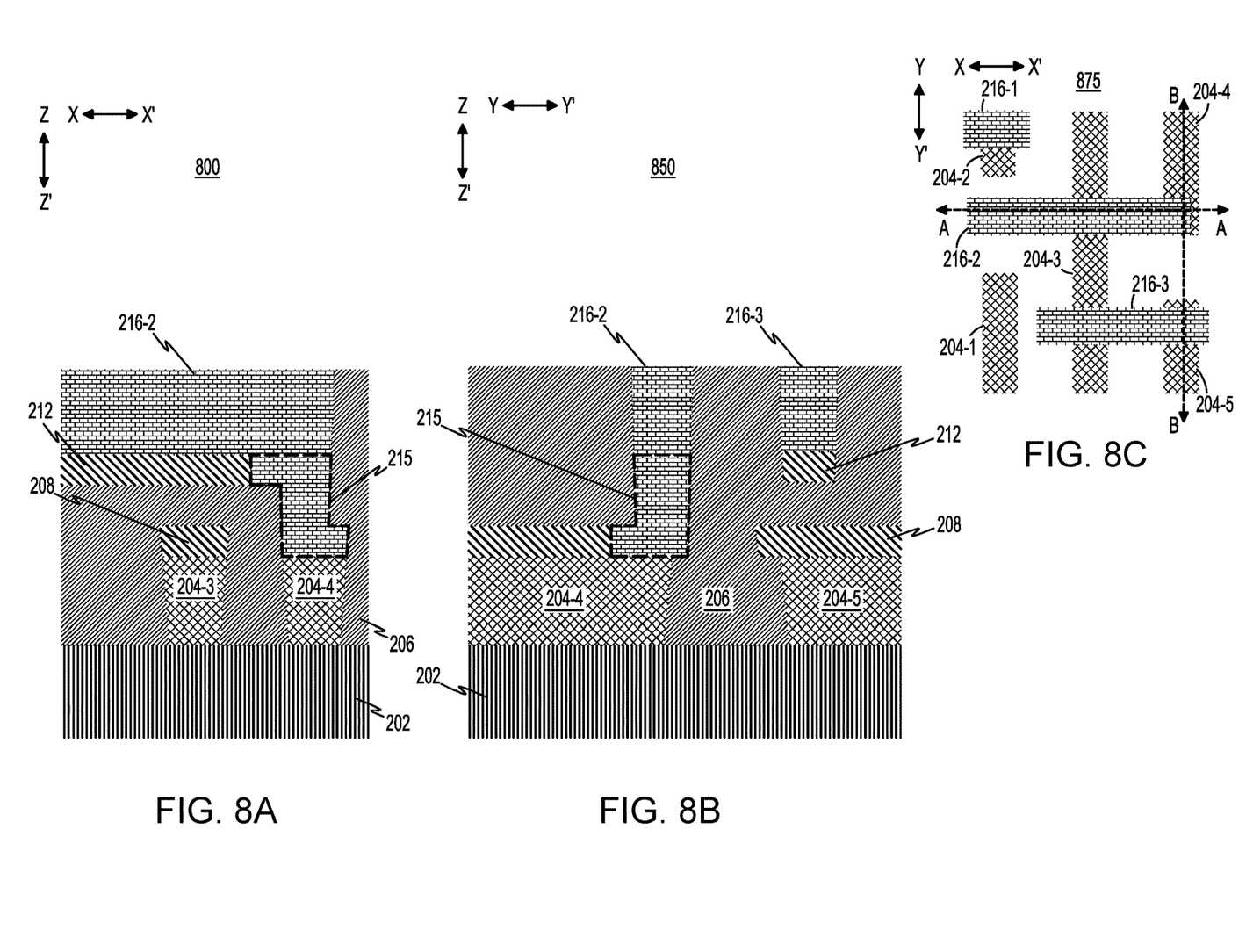
FIG. 8A depicts a first side cross-sectional view of the structure shown in FIGS. 7A-7C following formation of vias and the second level of interconnect lines, according to an embodiment of the invention.
FIG. 8B depicts a second side cross-sectional view of the structure shown in FIGS. 7A-7C following the formation of the vias and the second level of interconnect lines, according to an embodiment of the invention.
FIG. 8C depicts a top-down view of the structure shown in FIGS. 7A-7C following the formation of the vias and the second level of interconnect lines, according to an embodiment of the invention.

FIGS. 8A-8C show a first side cross-sectional view 800, a second side cross-sectional view 850 and a top-down view 875 of the structure shown in FIGS. 7A-7C, following formation of via 215 and the second level of interconnect lines 216. The first side cross-sectional view 800 of FIG. 8A is taken along the line A-A in the top-down view 875, and the second side cross-sectional view 850 of FIG. 8B is taken along the line B-B in the top-down view 875.

To form the via 215 and the second level of interconnect lines 216, the patterning layer 214 and HM layer 210 are removed. The patterning layer 214 and HM layer 210 may be removed using RIE or other suitable processing such as selective wet etch processing. Material for the via 215 and interconnect lines 216 is then deposited, filling the regions 701 and 703 as illustrated. The via 215 and interconnect lines 216 may be formed of materials similar to that of the interconnect lines 204.

As illustrated, the via 215 has L-shaped and Z-shaped extensions (e.g., into the regions 701 and 703 where portions of the dielectric capping layers 208 and 212 were removed as described above). Thus, the via 215 has a strong landing (e.g., a wider area than without performance of the isotropic etching of the dielectric capping layer 208) on the interconnect line 204-4. Similarly, the interconnect line 216-2 has a strong landing (e.g., a wider area than without performance of the isotropic etching of the dielectric capping layer 212) on the via 215. This increased area is illustrated by comparison with the structure shown in FIGS. 9A-9C which is not formed with isotropic etching of dielectric capping layers. The dielectric capping layers 208 and 212 further mitigate the potential for unintended shorting between different ones of the interconnect lines 204 and 216.

Figure 9A:
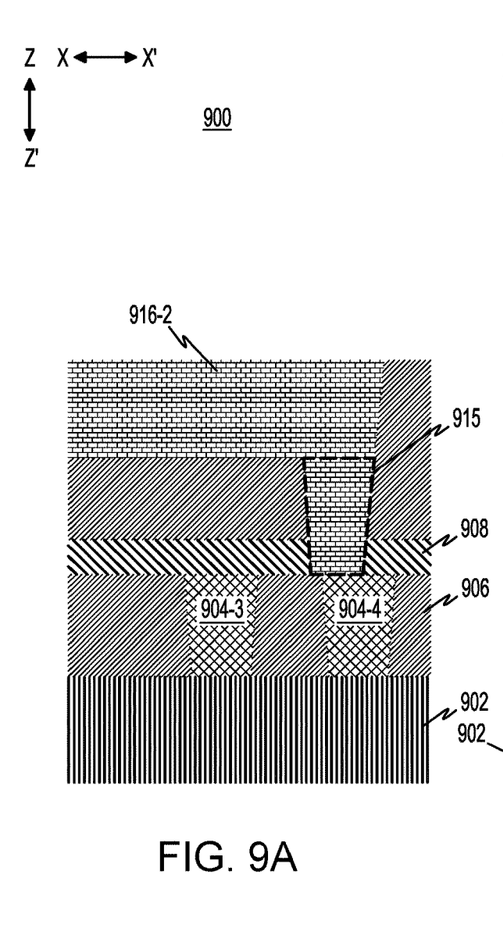
FIG. 9A depicts a first side cross-sectional view of a structure with weak landing of vias interconnecting first and second levels of interconnect lines, according to an embodiment of the invention.
Figures 9B, 9C:
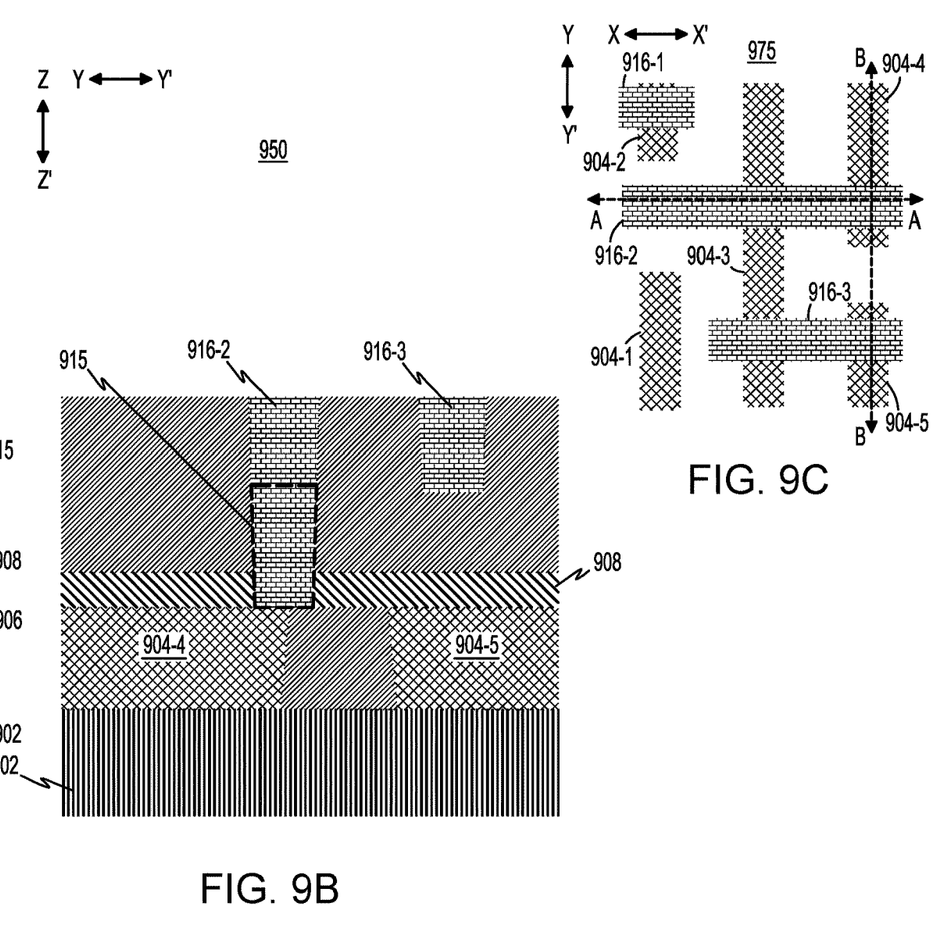
FIG. 9B depicts a second side cross-sectional view of a structure with weak landing of vias interconnecting first and second levels of interconnect lines, according to an embodiment of the invention.
FIG. 9C depicts a top-down view of a structure with weak landing of vias interconnecting first and second levels of interconnect lines, according to an embodiment of the invention.

FIG. 9A shows a first side cross-sectional view 900 of a structure including underlying device 902, first level (e.g., Mx-1) interconnect lines 904-1, 904-2, 904-3, 904-4 and 904-5 (collectively, interconnect lines 904), ILD layer 906, dielectric layer 908, via 915 (e.g., in a Vx via level connecting the Mx-1 and Mx interconnect levels) and second level (e.g., Mx) interconnect lines 916-1, 916-2 and 916-3 (collectively, interconnect lines 916). FIG. 9B shows a second side cross-sectional view 950 of the structure, and FIG. 9C shows a top-down view 975 of the structure. The first side cross-sectional view 900 of FIG. 9A is taken along the line A-A in the top-down view 975, and the second side cross-sectional view 950 of FIG. 9B is taken along the line B-B in the top-down view 975. As shown in FIGS. 9A-9C, the via 915 has a weaker landing on the interconnect line 904-4 relative to the via 215 and the interconnect line 204-4.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 10:
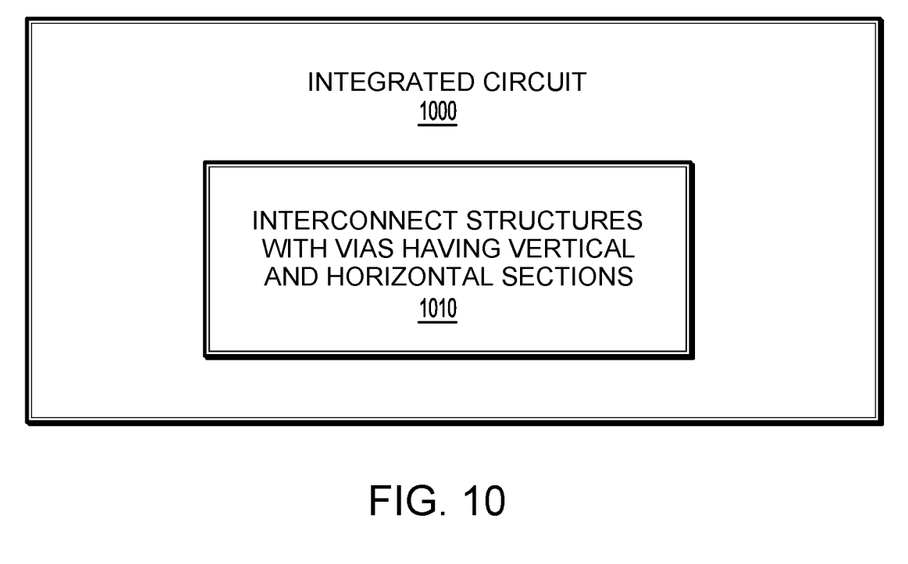
FIG. 10 depicts an integrated circuit comprising one or more interconnect structures with vias having vertical and horizontal sections, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 10 shows an example integrated circuit 1000 which includes one or more interconnect structures 1010 with vias having vertical and horizontal sections.

In some embodiments, a microelectronic structure comprises a first interconnect line at a first interconnect level, a second interconnect line at a second interconnect level, and at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

The at least one horizontal section may comprise a first horizontal section in contact with at least a portion of the top surface of the first interconnect line and a second horizontal section in contact with at least a portion of the bottom surface of the second interconnect line.

One or both of the first interconnect line and the second interconnect line may have one of a zero and a negative line extension to the at least one via.

The microelectronic structure may further comprise a dielectric capping layer disposed over at least a portion of a top surface of the first interconnect line, wherein the at least one horizontal section of the at least one via abuts at least one edge of the dielectric capping layer.

The microelectronic structure may further comprise a dielectric capping layer disposed on at least a portion of a bottom surface of the second interconnect line, wherein the at least one horizontal section of the at least one via abuts at least one edge of the dielectric capping layer.

The microelectronic structure may further comprise a first dielectric capping layer disposed over at least a portion of a top surface of the first interconnect line and a second dielectric capping layer disposed on at least a portion of a bottom surface of the second interconnect line, wherein the at least one horizontal section of the at least one via comprises a first horizontal section abutting at least one edge of the first dielectric capping layer and a second horizontal section abutting at least one edge of the second dielectric capping layer.

The vertical section and the at least one horizontal section may provide an L-shaped corner extending from outside an end of the first interconnect line to at least a portion of a top surface of the first interconnect line.

The vertical section and the at least one horizontal section may provide a Z-shape extending from outside ends of the first and second interconnect lines.

In some embodiments, an integrated circuit comprises an interconnect structure comprising a first interconnect line at a first interconnect level, a second interconnect line at a second interconnect level, and at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

The at least one horizontal section may comprise a first horizontal section in contact with at least a portion of the top surface of the first interconnect line and a second horizontal section in contact with at least a portion of the bottom surface of the second interconnect line.

At least one of the first interconnect line and the second interconnect line may have one of a zero and a negative line extension to the at least one via.

The interconnect structure of the integrate circuit may further comprise a first dielectric capping layer disposed over at least a portion of a top surface of the first interconnect line and a second dielectric capping layer disposed on at least a portion of a bottom surface of the second interconnect line, wherein the at least one horizontal section of the at least one via comprises a first horizontal section abutting at least one edge of the first dielectric capping layer and a second horizontal section abutting at least one edge of the second dielectric capping layer.

In some embodiments, a method of forming a microelectronic structure comprises forming a first interconnect line at a first interconnect level, forming a second interconnect line at a second interconnect level, and forming at least one via connecting the first interconnect line at the first interconnect level to the second interconnect line at the second interconnect level. The at least one via comprises a vertical section and at least one horizontal section, the at least one horizontal section being in contact with at least a portion of one of a top surface of the first interconnect line and a bottom surface of the second interconnect line.

The method may further comprise forming a first portion of an interlayer dielectric layer, the first portion of the interlayer dielectric layer surrounding the first interconnect line at the first interconnect level, recessing the first interconnect line below a top surface of the first portion of the interlayer dielectric layer, and forming a first dielectric capping layer over a top surface of the first interconnect line.

The method may further comprise forming a second portion of the interlayer dielectric layer over the first portion of the interlayer dielectric layer and a top surface of the first dielectric capping layer, patterning a hard mask layer over a top surface of the second portion of the interlayer dielectric layer, etching the second portion of the interlayer dielectric layer exposed by the hard mask layer, and forming a second dielectric capping layer on top surfaces of the etched second portion of the interlayer dielectric layer.

The method may further comprise forming a patterning layer over the second dielectric capping layer and the hard mask layer, the patterning layer exposing a region where the at least one via is formed, and etching portions of the second dielectric capping layer, the interlayer dielectric layer and the first dielectric capping layer exposed by the patterning layer.

The method may further comprise performing an isotropic etch of the second dielectric capping layer and the first dielectric capping layer to define at least one region where at least a portion of the at least one horizontal section of the at least one via is formed.

The method may further comprise removing the patterning layer and the hard mask layer and forming a material of the at least one via and the second interconnect line.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A microelectronic structure, comprising:
   a first interconnect line at a first interconnect level;
   a second interconnect line at a second interconnect level; and
   at least one via connecting the first interconnect line at the first interconnect level to the second interconnect line at the second interconnect level;
   wherein the at least one via comprises a vertical section and at least one horizontal section, the at least one horizontal section being in contact with at least a portion of one of a top surface of the first interconnect line and a bottom surface of the second interconnect line.

2. The microelectronic structure of claim 1, wherein the at least one horizontal section comprises a first horizontal section in contact with at least a portion of the top surface of the first interconnect line and a second horizontal section in contact with at least a portion of the bottom surface of the second interconnect line.

3. The microelectronic structure of claim 1, wherein the first interconnect line has one of a zero and a negative line extension to the at least one via.

4. The microelectronic structure of claim 1, wherein the second interconnect line has one of a zero and a negative line extension to the at least one via.

5. The microelectronic structure of claim 1, wherein both the first interconnect line and the second interconnect line each have one of a zero and a negative line extension to the at least one via.

6. The microelectronic structure of claim 1, further comprising a dielectric capping layer disposed over at least a portion of a top surface of the first interconnect line, wherein the at least one horizontal section of the at least one via abuts at least one edge of the dielectric capping layer.

7. The microelectronic structure of claim 1, further comprising a dielectric capping layer disposed on at least a portion of a bottom surface of the second interconnect line, wherein the at least one horizontal section of the at least one via abuts at least one edge of the dielectric capping layer.

8. The microelectronic structure of claim 1, further comprising a first dielectric capping layer disposed over at least a portion of a top surface of the first interconnect line and a second dielectric capping layer disposed on at least a portion of a bottom surface of the second interconnect line, wherein the at least one horizontal section of the at least one via comprises a first horizontal section abutting at least one edge of the first dielectric capping layer and a second horizontal section abutting at least one edge of the second dielectric capping layer.

9. The microelectronic structure of claim 1, wherein the vertical section and the at least one horizontal section provide an L-shaped corner extending from outside an end of the first interconnect line to at least a portion of a top surface of the first interconnect line.

10. The microelectronic structure of claim 1, wherein the vertical section and the at least one horizontal section provide a Z-shape extending from outside ends of the first and second interconnect lines.

11. An integrated circuit comprising:
    an interconnect structure comprising:
      a first interconnect line at a first interconnect level;
      a second interconnect line at a second interconnect level; and
      at least one via connecting the first interconnect line at the first interconnect level to the second interconnect line at the second interconnect level;
    wherein the at least one via comprises a vertical section and at least one horizontal section, the at least one horizontal section being in contact with at least a portion of one of a top surface of the first interconnect line and a bottom surface of the second interconnect line.

12. The integrated circuit of claim 11, wherein the at least one horizontal section comprises a first horizontal section in contact with at least a portion of the top surface of the first interconnect line and a second horizontal section in contact with at least a portion of the bottom surface of the second interconnect line.

13. The integrated circuit of claim 11, wherein at least one of the first interconnect line and the second interconnect line has one of a zero and a negative line extension to the at least one via.

14. The integrated circuit of claim 11, further comprising a first dielectric capping layer disposed over at least a portion of a top surface of the first interconnect line and a second dielectric capping layer disposed on at least a portion of a bottom surface of the second interconnect line, wherein the at least one horizontal section of the at least one via comprises a first horizontal section abutting at least one edge of the first dielectric capping layer and a second horizontal section abutting at least one edge of the second dielectric capping layer.

15. A method of forming a microelectronic structure, comprising:
forming a first interconnect line at a first interconnect level;
forming a second interconnect line at a second interconnect level; and
forming at least one via connecting the first interconnect line at the first interconnect level to the second interconnect line at the second interconnect level;
wherein the at least one via comprises a vertical section and at least one horizontal section, the at least one horizontal section being in contact with at least a portion of one of a top surface of the first interconnect line and a bottom surface of the second interconnect line.

16. The method of claim 15, further comprising:
forming a first portion of an interlayer dielectric layer, the first portion of the interlayer dielectric layer surrounding the first interconnect line at the first interconnect level;
recessing the first interconnect line below a top surface of the first portion of the interlayer dielectric layer; and
forming a first dielectric capping layer over a top surface of the first interconnect line.

17. The method of claim 16, further comprising:
forming a second portion of the interlayer dielectric layer over the first portion of the interlayer dielectric layer and a top surface of the first dielectric capping layer;
patterning a hard mask layer over a top surface of the second portion of the interlayer dielectric layer;
etching the second portion of the interlayer dielectric layer exposed by the hard mask layer; and
forming a second dielectric capping layer on top surfaces of the etched second portion of the interlayer dielectric layer.

18. The method of claim 17, further comprising:
forming a patterning layer over the second dielectric capping layer and the hard mask layer, the patterning layer exposing a region where the at least one via is formed; and
etching portions of the second dielectric capping layer, the interlayer dielectric layer and the first dielectric capping layer exposed by the patterning layer.

19. The method of claim 18, further comprising performing an isotropic etch of the second dielectric capping layer and the first dielectric capping layer to define at least one region where at least a portion of the at least one horizontal section of the at least one via is formed.

20. The method of claim 19, further comprising:
removing the patterning layer and the hard mask layer; and
forming a material of the at least one via and the second interconnect line.

* * * * *